United States Patent
Hanni

[11] 3,934,334
[45] Jan. 27, 1976

[54] METHOD OF FABRICATING METAL PRINTED WIRING BOARDS

[75] Inventor: Stephen L. Hanni, Richardson, Tex.

[73] Assignee: Texas Instruments Incorporated, Dallas, Tex.

[22] Filed: Apr. 15, 1974

[21] Appl. No.: 461,072

[52] U.S. Cl. ............... 29/625; 53/30 S; 174/68.5; 317/101 B; 427/27; 427/28; 427/96; 427/97
[51] Int. Cl.² ................................. H05K 3/10
[58] Field of Search ............ 29/624, 625; 174/68.5; 317/101 B; 117/212, 213, 215, 217, 218, 230, 38, 45, 47, 66–67, 71 M, 75, 130 E, 132 A, 132 B, 132 C; 204/15, 29, 30; 156/3, 4; 53/30 S

[56] References Cited
UNITED STATES PATENTS

| | | | |
|---|---|---|---|
| 3,294,951 | 12/1966 | Olson | 29/626 X |
| 3,334,395 | 8/1967 | Cook et al. | 174/68.5 X |
| 3,488,913 | 1/1970 | Burgess | 53/30 S |
| 3,558,441 | 1/1971 | Chadwick et al. | 204/15 |
| 3,600,875 | 8/1971 | Buob et al. | 53/30 S |
| 3,610,811 | 10/1971 | O'Keefe | 29/626 X |
| 3,673,680 | 7/1972 | Tanaka et al. | 29/626 |
| 3,698,940 | 10/1972 | Mesereau et al. | 204/30 X |
| 3,704,208 | 11/1972 | Russo | 204/30 X |
| 3,745,095 | 7/1973 | Chadwick et al. | 174/68.5 UX |
| 3,778,532 | 12/1973 | Braden | 29/626 X |

Primary Examiner—C. W. Lanham
Assistant Examiner—Joseph A. Walkowski
Attorney, Agent, or Firm—Harold Levine; René E. Grossman; Alva H. Bandy

[57] ABSTRACT

An additive process for producing printed wiring boards is taught. In the process metal substrates having desired hole patterns are powder coated with a dielectric material electrostatically. The dielectric powder coating is then fused on the metal substrate. Next, a continuous film of pre-catalyzed adhesive is applied to all surfaces; then a plating resist is applied to all areas on which copper is not desired. The exposed catalyzed adhesive is then activated and plated in an electroless copper bath.

11 Claims, 6 Drawing Figures

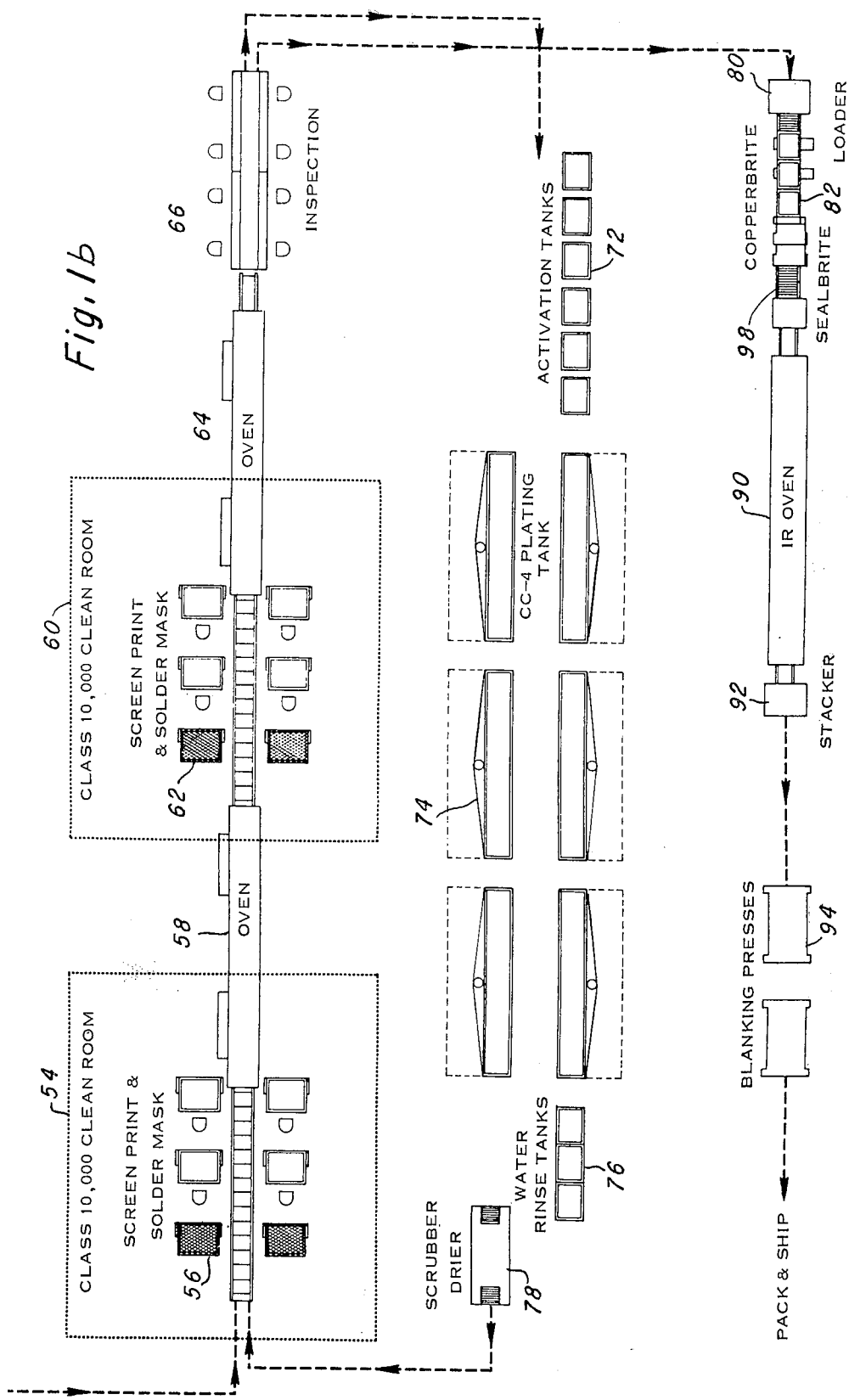

METHOD OF FABRICATING METAL PRINTED WIRING BOARDS

This invention relates to printed wiring boards, and more particularly to printed wiring boards utilizing metal substrates.

In the past, circuit board manufacturing techniques have been basically substractive in nature. That is, in order to form conductive patterns, the unwanted areas of the copper foil on the surfaces of the laminate must be etched away using either etch resistant films or overplated metal to protect the conductors during etching. Tight packaging requirements for interconnecting multipin medium scale integrated circuits and large scale integrated devices are difficult to meet with the subtractive technology. Major problems with the subtractive technology are as follows:

Undercutting which contributes major dimensional tolerance in conductor widths below 10 mils, and effectively limits the conductor widths that can be manufactured by existing mass production processes;

Uneven plating in the hole, which results from the field distribution around the work piece being plated, requires the drill hole diameter to be increased to avoid violating the minimum hole diameter required after plating;

Uneven plating in the hole also imposes an additional restraint on the depth of the hole that can be successfully plated with adequate yield under normal production conditions.

The above-mentioned problems attending the subtractive technique have been substantially reduced by an additive circuit manufacturing process. An additive process is one in which the conductor pattern is added directly to a catalyzed, selectively activated insulating base or to a base covered with a very thin layer of copper rather than being formed by etching from laminated copper foil. Major problems with the additive technology are as follows:

Electrolysis copper baths have been hard to control or maintain;

Conductor peel strengths have generally been lower than laminated copper;

Bath plating cycle is typically 20 times longer than that for an equivalent electro-plated part.

In either the subtractive or additive processes a great variety of base materials have been used as insulating support. These include, for example, paper base phenolics, epoxy paper, polyester glass mat, Mylar, Teflon, Kapton, and other flexible films, ceramics, plastic molded parts, and insulated metal blanks. In the past, the insulated metal blanks have utilized rugged, plastic coatings that are applied to the fabricated blanks using a pre-heated substrate and a fluidized bed powder coating process. Disadvantages of a heated substrate fluidized bed powder coating are as follows:

Pinhole free coatings require approximately 15 mils of coating;

The need for a heated substrate creates difficulty in coating thickness control;

Typical 15 mil coatings adversely affect overall printed wiring board thickness;

Increased material costs due to the need for a 15 mil coating thickness.

Accordingly, it is an object of the present invention to provide a method of fabricating a metal printed wiring board which is both economical and capable of mass production techniques.

Another object of the invention is the provide a metal printed wiring board having substantially increased strength over prior board constructions and which does not flex or warp during wave solder.

Still another object of the invention is to provide a metal printed wiring board whose metal substrate acts as a heat sink for the active components, and the thermal path to the metal substrate is of minimal length.

Yet another object of the invention is to provide a method of fabricating a metal substrate printed wiring board having complete edge and corner coverage with a pinhole free coating of 5 mils thickness.

Yet another object of the invention is to provide a metal printed wiring board in which the metal substrate is available to act as ground plane thereby lending the invention to devices requiring this type of board.

Still yet another object of the invention is to provide a method of fabricating a metal printed wiring board which enhances automatic insertion of components owing to the funnel shaped holes provided by this process.

Still yet another object of the invention is to provide a method of fabricating a durable and highly reliable metal printed wiring board with pre-heating and the necessary controls therefor.

Briefly stated the invention comprises an additive process for producing printed wiring boards on a metal substrate. To adapt the process to mass production techniques the metal substrate is utilized in coil form and has a lead frame that is used for material handling during fabrication assembly, and test of the printed wiring board. During fabrication a coil of sheet metal is unwound; the substrates and the desired hole patterns are formed in the sheet metal by piercing, blanking and or chemical milling. A powder coating of dielectric material is then electrostatically applied to both sides of the metal blank. The dielectric powder coating is then thermally fused or cured on the metal substrate. Next a continuous film of precatalyzed adhesive is applied to all surfaces. This adhesive coating is then thermally dried and cured. A plating resist is next applied to all areas on which copper is not desired. The exposed catalyzed adhesive is then activated and plated in an electroless copper bath. The metal substrate material remains in coil form throughout the process including final component assembly and wave soldering.

These and other objects and features of the invention will become more readily understood in the following detailed description taken in conjunction with the drawings, wherein:

FIGS. 1a and b are block diagrams of an assembly line for manufacturing printed wiring boards in accordance with the invention;

Figure 1A:
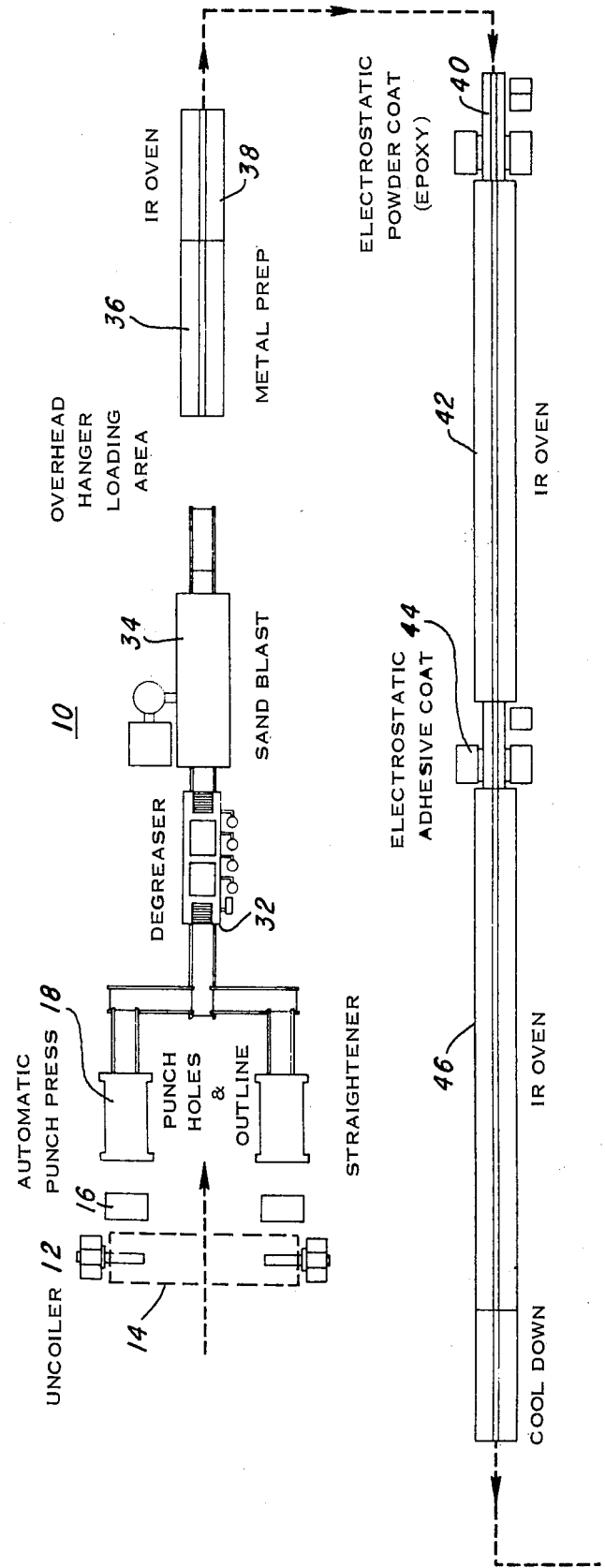
Figure 2:
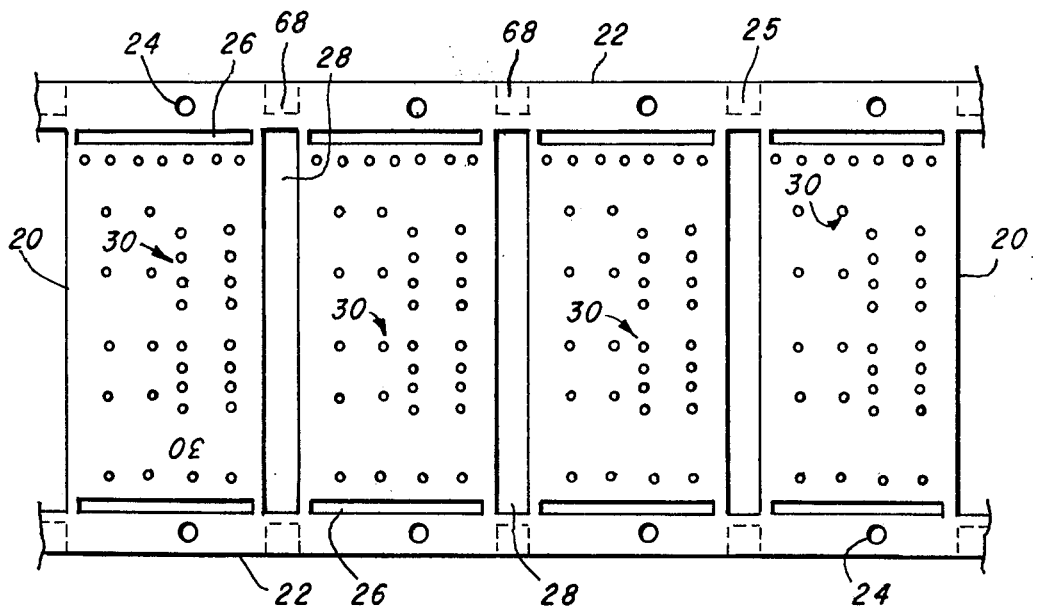
FIG. 2 is a fragmentary view of the lead frame and metal substrates for the printed wiring board as blanked in the sheet metal.

Referring now to FIGS. 1a and 1b for a detailed description of the invention, in FIG. 1a there is shown a mass production assembly of fabrication line 10 beginning with an uncoiler 12 for a coil of sheet metal 14 which may be, for example, a coil of sheet steel, copper or aluminum or an alloy thereof about 16–30 mils thick. The coil of sheet metal is initially fed into a metal straightener 16 which may be of the roller type. Thereafter, the rolls of the metal straightener 16 pull the steel from the uncoiler 12. After straightening, the steel passes into an automatic punch press 18 for forming a plurality of metal substrates 20 (FIG. 2) between a lead frame 22. The automatic punch press 18 blanks: sprocket holes 24 and spacer tabs 25 in the lead frame 22; horizontal slits 26, which separate the metal substrates 20 from the lead frames 22, and longitudinal slits 28, which separate the metal substrates 22 one from another; and a desired pattern of holes 30 in each of the metal substrates 20. The coil feed system and automatic punch press may be, for example, an integrated press and coil feed system such as that manufactured by Wing United Incorporated. The blanked sheet metal is then deburred by a suitable method such as, for example, sand blasting.

The blanked metal sheet 14 is then passed through a degreaser 32. The degreaser 32 may be of the spray type which includes; a compartment for a vapor type degreaser such as, for example, trichloroethylene; a tank containing a rust removal chemical, such as for example, a solution of hydrochloric acid, a first water rinse compartment for rinsing off hydrochloric acid; a second tank containing an alkaline solution such as, for example, that sold under the trademark, Oakite 190; a second water rinse compartment for rinsing away the alkaline solution; a third tank containing a zinc-phosphate solution which may be, for example, that sold under the trademark Phosdip R2; and a second degreaser compartment where the blanked metal sheet is degreased and vapor dried with, for example, trichloroethylene. The blanked sheet metal is subjected to the degreasing vapor for about 5 to 10 minutes, the rust removal chemical until the rust or metal oxide is removed, the alkaline solution for about 3–5 minutes, the zinc phosphate solution for about 6 minutes, and the drying vapor until dry. When dry, the blanked sheet metal is passed through a sandblaster 34 to deburr both sides. Upon leaving the dryer the blanked metal sheet is recoiled and loaded into an overhead hanger area.

The blanked sheet metal is next prepared for electrostatic powder coating by drawing the metal through the metal preparing device 36 where it is washed and dried. The blanked sheet metal is passed through an oven 38, which may be an infrared type oven, to heat the blanked sheet metal to a temperature of about 300° to 500°F immediately prior to insertion into a powder booth or bed 40. The booth or bed 40 is equipped with either manually operated or automatic powder coating guns for electrostatically powder coating the blanked sheet metal. Suitable powder coating materials are readily available and sold under the trademarks, Naresa 285; Pratt and Lambert 88-922; Polymer Corporation ECA-1283WHN; and Minnesota Mining and Manufacturing Company Scotchkote 2017. After powder coating, the blanked sheet metal is heated in an oven 42 at 500°F for 10 minutes to cure or fuse the insulating coat. A suitable electrostatic powder coating system is that sold by Nordson Corporation.

The powder coating after fusing or curing is a dielectric coat 43 (FIG. 5) which insulates the metal substrates from the electrical circuitry of the printed wiring boards. Thus, the insulating coat so formed has a smooth, pinhole free surface to provide absolute electrical insulation, excellent corner and edge covering, good punch through and cut through characteristics, and a dielectric strength equal to or greater than 500 volts per mil. In addition the insulating coat is abrasive resistant and temperature stable continuously through a minimum of 120° to 130° and for a minimum of 30 seconds at 500°F or 260°C.

The insulated blanked metal sheet is next ready for a pre-catalytic adhesive coat 45 (FIG. 5) which may be applied to all surfaces by any suitable apparatus 44 (FIG. 1a) such as a double side roller, sprayer or dip tank. A suitable adhesive is a palladium filled adhesive sold under the trademark RC204 by Photocircuits Incorporated. Preferably, the insulated blanked metal sheet is given a minimum of 1 mil dry film of adhesive.

The adhesive coating is then cured in an IR oven 46 for about 7 to 12 minutes at temperature between 325°F to 435°F to drive off solvents contained therein. The adhesive coated insulated blanked sheet of metal is moved to the image line (FIG. 1b).

Figure 3:
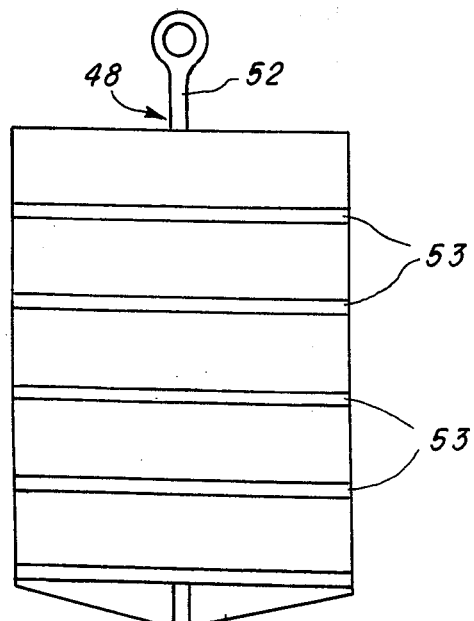
FIG. 3 is a side view showing a plurality of the metal substrate coils stacked on a rewind stand for electroless electroplating.
Figure 4:
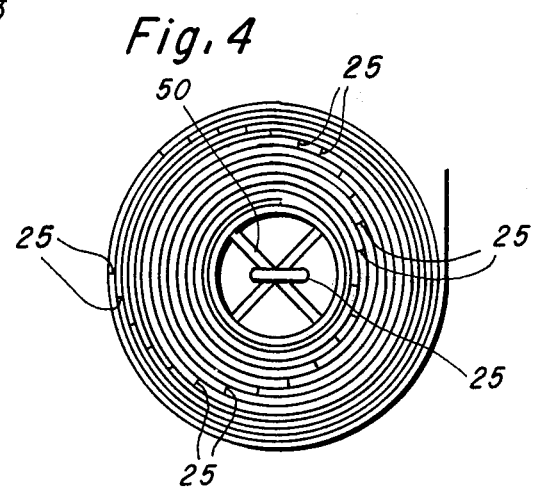
FIG. 4 is a top view of the stacked coils of metal substrates.
Figure 5:
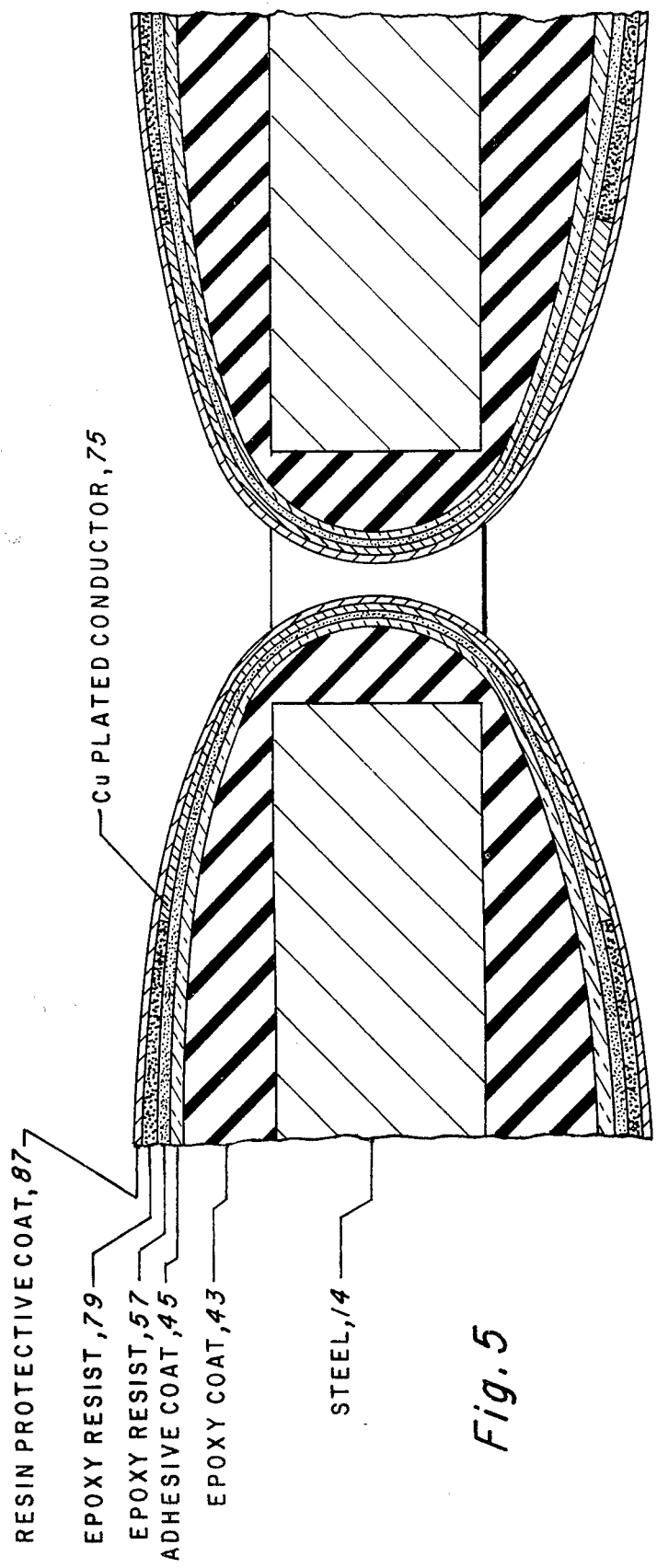
FIG. 5 is a sectional view of a portion of the printed wiring board showing the coatings and conductor on the metal substrate and in a hole thereof.

At the imaging line (FIG. 1b), the coil of adhesive coated, insulated blanked sheet of metal substrates is uncoiled in a clean room 54 and the lead frames 22 (FIG. 2) carrying the adhesive coated insulated metal substrates are advanced by sprockets engaging the sprocket holes 24 to pass the adhesive coated insulated metal substrates through an inline screen printer 56 for printing the first side with a plating resist 57 (FIG. 5). A suitable printer is that sold under the trademark ITRON Screen Printer using an epoxy resist such as that sold under the Trademark E12 by Photocircuits Incorporated. The silk screen conductor pattern is a negative pattern, i.e., every thing is coated except the desired conductor pattern. The screen printed sheet of adhesive coated insulated metal substrates (FIG. 1b) is then cured in an IR oven 58 for 2½ to 3 minutes at 330°F, and advanced to a second clean room 60 containing a second ITRON Screen Printer 62 where the second side of the adhesive coated insulated metal substrate is screen printed. The screen print of the second side is cured in oven 64. The screened metal substrates are then passed through an inspection point 66 for inspection prior to recoiling on a coil plating rack 48 (FIG. 3) for transport to the electroless copper plating area. The coil plating rack has a coil retaining member 50 normal to a centrally disposed stacking rod 52. Thus, several coils can be stacked on the coil plating rack and spaced one from the other by spacers 53. During rewind spacing tabs 25 (FIG. 2) are bent normal to the lead frame 22 to maintain a spacing between the rings of the coil as shown in FIG. 4.

The stacked coils of plating resist imaged, adhesive coated, insulated metal substrates are placed in activation tanks 72 containing, for example, a mixture of chromic acid and sulfuric acid, or chromic acid and bromo-flouric acid for etching locking micropores in the conductor pattern defined by the exposed adhesive. Next, the activated, plating resist imaged, adhesive coated, insulated metal substrates are deposited in plating tanks 74 containing a suitable electroless metal (copper) plating solution. A suitable copper solution is any one of the solutions of the examples found in U.S. Pat. No. 3,095,309 issued June 25, 1963. The coils are left in the electroless copper plating solution for approximately 18 to 20 hours for copper plating the conductor pattern 75 (FIG. 5) printed wiring boards (FIG.

5). At this stage, if desired, nickel boron solution can be used to plate all copper circuitry while still in coil form. Nickel boron has been found to be acceptable replacement for any required gold tabs. The copper plated coils are then placed in rinse tanks 76 (FIG. 1b) and rinsed with water to remove the electroless plating solution.

The metal plated coils are then unwound and passed through a scrubber dryer 78 for drying and removal of spurious plating from the metal circuitry. A scrubber utilizing fine stainless steel wire brushes has proven satisfactory for this operation. The printed wiring boards are then returned to the clean room 54 for screen printing a solder mask 79 on the first side (FIG. 5). An epoxy such as, Photocircuits PC-401 Soldermask, is screened on to cover all areas not tobe soldered. The solder mask bearing metal substrates are then passed through the oven 58 (FIG. 1b) for curing and into the clean room 60. In clean room 60 the second side of the printed wiring board is screen printed to form a solder mask as was done for the first side. The solder masked parinted wiring boards are then cured in oven 64 for 2½ to 3 minutes at 325°F. The solder masked printed wiring boards are inspected by the inspection apparatus 66, recoiled onto the coil plating rack 48 and placed in loader 80. If the printed wiring boards have been exposed to the air, the coil is fed into a spray system 82 having mild etch, such as that sold under the trademark Copperbrite, to remove any copper oxide from the circuit pads. An alternative method would be to feed the material into an etch tank on a roller system. After etching a water rinse 84 is used to neutralize the etchant, and the printed wiring boards are then dried by air knives or turbines 86. Next, the sheet of printed wiring boards is passed through a suitable apparatus 88 containing a rosin to coat the printed wiring boards and in particular the circuit pads with a thin protective coat 87 (FIG. 5). A suitable apparatus comprises a double sided roller coater, or a dip tank, or a spray system utilizing a rosin based material such as that sold under the trademark Lonco SealBrite 230-10-100. The rosin based material protects the copper plating from oxidation. From the sealbrite apparatus 88 (FIG. 1b), the sheet of printed wiring boards is passed through an IR type conveyerized oven 90 with a V-type conveyer system. The oven is used to drive off solvents and includes a cool down section to reduce tackiness that might result from the heating of the sealbrite coating. After leaving the oven 90, the sheet of printed wiring boards are coiled on the coil plating rack 48 for either shipping to an assembly area in coil form or passing through a blanking press 94 to cut out the printed circuit boards one from another and from the lead main frame for packing and shipping to the assembly area not shown.

The coiled sheet of printed wiring boards or the stacked pprinted wiring boards are shipped to the assembly area on a supporting pallet. The pallet and coil or stack of boards are covered with a heat shrink plastic for protection. At the assembly area the coil of printed wiring boards are unwound into an automatic system which utilizes the lead frame as an index fixture and the spacer tabs as assembly stands. At the assembly line all other active components are assembled onto the printed wiring boards with their leads inserted in the holes of the printed wiring board. The leads are electrically coupled to the printed wiring boards preferably by a wave soldering technique. For wave soldering the board is foam or wave coated with a suitable flux such as, for example, that sold under the trademark Alpha No. 711 Flux. The boards are then preheated to 170°–210°F in a preheat oven and wave soldered at 3–6 feet per minute on a flowing stream of solder pumped up through an orifice at 480°F. Contact time with the wave is 5–10 seconds. Wave soldering, cleaning and test can all be done while using the lead frame as a material handling device.

Although only a single embodiment of the invention has been described herein, it will be apparent to a person skilled in the art that various modifications to the details of construction shown and described may be made without departing from the scope of this invention.

I claim:
1. A method for fabricating printed wiring boards comprising:
 a. forming a metal substrate having a circuit hole pattern;
 b. electrostatically powder coating the metal substrate and hole forming walls with a suitable dielectric;
 c. fusing the dielectric powder coating to electrically insulate the metal substrate including the apertures thereof from electrical circuitry; and
 d. forming electrical circuitry on the dielectric in conjunction with the hole patterns.

2. A method for fabricating printed wiring boards comprising:
 a. blanking sheet metal to form a sheet of metal substrates having circuit hole patterns;
 b. electrostatically powder coating the metal substrates and hole forming walls with a suitable dielectric;
 c. fusing the dielectric powder coating to electrically insulate the metal substrates including the apertures thereof from electrical circuitry;
 d. coating the dielectric with a catalyzed adhesive; and
 e. forming electrical circuitry on the dielectric in conjunction with the hole patterns.

3. A method for fabricating printed wiring boards comprising:
 a. blanking sheet metal for outlining a plurality of metal substrates, forming hole patterns within said plurality of outlined metal substrates, and forming lead frames adjacent horizontally disposed edges of the sheet metal with holes therein for use in advancing the sheet metal and outlines of metal tabs;
 b. preparing the sheet metal for coating with a layer of insulating material;
 c. electrostatically powder coating surfaces of the metal substrates of the sheet metal with a dielectric;
 d. fusing the coating for thermosetting the dielectric for electrically insulating the metal substrates;
 e. coating all the dielectric insulating coating with an adhesive coating in preparation for forming conductor patterns and through hole interconnections by metallization;
 f. forming conductor patterns on the adhesive coating;
 g. partially removing the adhesive coating from the conductor patterns to form metal plating locking micropores;
 h. electrolessly plating the conductor patterns with an electrically conducting material;

i. selectively forming soldering patterns;
j. removing any oxide forming on the exposed soldering patterns; and
k. sealing the exposed soldering patterns to prevent oxidation of the soldering pattern whereby a plurality of printed wiring boards are formed between a lead frame.

4. A method for fabricating printed wiring boards according to claim 3 further including winding the printed wiring boards into a coil, placing the coil on a pallet, and wrapping the coil and pallet with heat shrink plastic.

5. A method for fabricating printed wiring boards according to claim 3 further including feeding the lead frame and plurality of printed wiring boards through a blanking press for removing the lead frame from the plurality of printed wiring boards, separating the printed wiring boards one from another, stacking them on a pallet, and covering the pallet and stack of printed wiring boards with heat shrink plastic.

6. A method for fabricating printed wiring boards according to claim 3 wherein the sheet metal blanked is ferrous or non-ferrous metals selected from the group consisting of steel, aluminum and copper and alloys thereof.

7. A method for fabricating printed wiring boards according to claim 3 wherein the sheet metal is prepared for the coating of insulating material by vapor degreasing both sides of the metal sheet, dipping the metal sheet in an acid solution to remove oxidized metal, rinsing the sheet metal to remove excess acid, dipping the metal sheet in an alkaline solution and rinsing to remove excess alkaline solution, phosphatizing the metal sheet, vapor degreasing until dry, and sand blasting the metal sheet to debur both sides.

8. A method for fabricating printed wiring boards according to claim 3 wherein said fused insulating coat is a smooth, substantially free pin hole coat insulating the metal sheet surfaces including the aperture forming walls, corners, and edges, and having a dielectric strength of not less than about 500 V per mil, and a temperature stability continuous between about 120°C and 130°C and a temperature stability for about 30 seconds at 260°C whereby the metal substrate can be utilized as a heat sink.

9. A method according to claim 3 wherein the metal tabs outlined in the lead frames are bent to form metal spacers for spacing the loops of the coiled metal substrates during plating of the conductor patterns.

10. A method according to claim 3 wherein the sealing of the exposed soldering patterns includes coating the epoxy soldering patterns with rosin.

11. A method according to claim 3 wherein the fabricating cycle is an automated cycle.

* * * * *